(12) United States Patent
Saito et al.

(10) Patent No.: US 7,826,196 B2
(45) Date of Patent: Nov. 2, 2010

(54) CERAMIC LAMINATED DEVICE AND METHOD FOR MANUFACTURING SAME

(75) Inventors: Ryuichi Saito, Osaka (JP); Koichi Shigeno, Osaka (JP); Hiroshi Kagata, Osaka (JP)

(73) Assignee: Panasonic Corporation, Osaka (JP)

( * ) Notice: Subject to any disclaimer, the term of this patent is extended or adjusted under 35 U.S.C. 154(b) by 316 days.

(21) Appl. No.: 12/161,901

(22) PCT Filed: Mar. 6, 2007

(86) PCT No.: PCT/JP2007/054281

§ 371 (c)(1),
(2), (4) Date: Jul. 23, 2008

(87) PCT Pub. No.: WO2007/119312

PCT Pub. Date: Oct. 25, 2007

(65) Prior Publication Data

US 2009/0034157 A1    Feb. 5, 2009

(30) Foreign Application Priority Data

Mar. 15, 2006    (JP) .............................. 2006-070599

(51) Int. Cl.
*H01G 4/06* (2006.01)
*H01G 4/005* (2006.01)

(52) U.S. Cl. ..................... 361/311; 361/303; 29/25.42

(58) Field of Classification Search ................ 361/311, 361/312–313, 320, 361, 321.1, 321.5
See application file for complete search history.

(56) References Cited

U.S. PATENT DOCUMENTS

| | | | |
|---|---|---|---|
| 6,195,248 B1* | 2/2001 | Kunishi et al. | 361/305 |
| 7,230,316 B2* | 6/2007 | Yamazaki et al. | 257/531 |
| 7,501,371 B2* | 3/2009 | Sasabayashi et al. | 501/138 |
| 2005/0051870 A1* | 3/2005 | Yamazaki et al. | 257/531 |
| 2007/0275506 A1* | 11/2007 | Yamazaki et al. | 438/118 |

FOREIGN PATENT DOCUMENTS

| | | |
|---|---|---|
| JP | 5-319922 | 12/1993 |
| JP | 8-55518 | 2/1996 |
| JP | 11-209172 | 8/1999 |
| JP | 2000-165048 | 6/2000 |
| JP | 2001-35741 | 2/2001 |
| JP | 2005-289701 | 10/2005 |

* cited by examiner

*Primary Examiner*—Eric Thomas
(74) *Attorney, Agent, or Firm*—McDermott Will & Emery LLP

(57) ABSTRACT

The present invention relates to a ceramic laminated device including a dielectric ceramic and an Ag electrode. In a dielectric ceramic that can be sintered at low temperatures and has a high dielectric constant and Q value, reactivity between the ceramic and Ag during sintering is suppressed low and segregation of specific elements in the proximity of the electrode is controlled. Thus, a filter having a high Q value and low loss is produced stably. For this purpose, in a ceramic laminated body including at least a ceramic and a Si-containing glass, a ratio of A/B, i.e. a ratio of a Si element concentration (A) within a range at a distance of 5 μm or smaller from the Ag electrode to a Si element concentration (B) within a range at a distance larger than 5 μm from the Ag electrode, is set equal to or smaller than 2.

13 Claims, 2 Drawing Sheets

CERAMIC LAMINATED DEVICE AND METHOD FOR MANUFACTURING SAME

RELATED APPLICATIONS

This application is the U.S. National Phase under 35 U.S.C. §371 of International Application No. PCT/JP2007/054281, filed on Mar. 6, 2007, which in turn claims the benefit of Japanese Application No. 2006-070599, filed on Mar. 15, 2006, the disclosures of which Applications are incorporated by reference herein.

TECHNICAL FIELD

The present invention relates to a ceramic laminated device and a method for manufacturing the ceramic laminated device.

BACKGROUND ART

With recent development of communication technology utilizing electromagnetic waves in the microwave range for use in a portable telephone and a wireless local area network (LAN), demand for downsizing the equipment is further increasing. In order to downsize such terminal equipment, downsizing high-frequency devices constituting the equipment, such as a high-frequency filter and a resonator, is necessary.

Examples of such high-frequency devices include a laminated dielectric filter. The laminated dielectric filter is made by adequately disposing an internal electrode (conductor metal) to form a capacitor or a strip line on an internal layer of a ceramic laminated body made of a dielectric ceramic. When the same resonance mode is used, the dimension of the high-frequency device is inversely proportional to the square root of the dielectric constant ($\in r$) of the dielectric material to be used. Thus, fabrication of a small resonance device requires a material having a high dielectric constant.

Other characteristics required of dielectric ceramic material include a low loss in the high-frequency range, i.e. a high Q value, and a small temperature coefficient of resonance frequency (TCF). The Q value is the inverse number of dissipation loss tan $\delta$. These characteristics allow the achievement of a high-performance filter having a low insertion loss, and excellent temperature stability.

On the other hand, an attempt is made to downsize a high-frequency device by adopting a laminated structure of a conductor metal and a dielectric ceramic composition and to obtain a high-performance device. At this time, the conductor metal is required to have a high electrical conductivity particularly in applications in the microwave range. For this reason, Ag or an alloy thereof is used in most cases. Because Ag has the highest electrical conductivity among metals, Ag is extremely advantageous in high-frequency applications. However, when a laminated structure of a conductor metal and a dielectric ceramic composition is made as described above, the conductor metal (internal electrode) and dielectric ceramic need to be fired at the same time. Thus, it is required to use a dielectric ceramic material that can densely be sintered under the firing conditions where the conductor metal to form the internal electrode neither melts nor oxidizes. In other words, it is required that the dielectric ceramic material can be fired at a temperature equal to or lower than the melting point of the conductor metal to be used, e.g. the melting point of Ag (961° C.) when Ag is used. A conventionally known example of such material is a Ba—Re—Ti—O-based material (Re being a rare-earth element) that contains various kinds of additives, glasses, or the like for lowering the sintering temperature added thereto. Such a material can provide a dielectric ceramic having a high dielectric constant, a high Q value, and a small TCF, while lowering the sintering temperature thereof (for example, see Patent Documents 1, 2, and 3).

However, the conventional art has the following problem, although the material can be sintered at approximately 900° C., at which Ag can be fired at the same time. When forming a ceramic laminated device, the ceramic material reacts with Ag during firing. This reaction makes the width or thickness of the electrode smaller than the designed value and thus hinders imparting sufficient characteristics. Further, segregation of Si or Zn, i.e. a component of the glasses or additives, or a multiple oxide thereof in the proximity of the electrode as a secondary phase is likely to decrease the Q value as a device and increase a loss.

[Patent Document 1] Japanese Patent Unexamined Publication No. H08-55518

[Patent Document 2] Japanese Patent Unexamined Publication No. H11-209172

[Patent Document 3] Japanese Patent No. 2786977

SUMMARY OF THE INVENTION

The present invention is directed to address these problems and provide a ceramic laminated device having a high Q value and a low loss at high yield. The ceramic laminated device is provided by minimizing the reaction between a dielectric ceramic and an Ag electrode thereof and inhibiting and controlling segregation of a secondary phase, such as Si or Zn, i.e. a component of glass or additive, and a multiple oxide thereof, in the proximity of the electrode.

In a ceramic laminated device, Ag is used as an internal electrode of a ceramic laminated body thereof composed of at least a ceramic and a Si-containing glass. A ratio of A/B, i.e. a ratio of a Si element concentration (A) in positions within a range at a distance of 5 μm or smaller from the Ag electrode to a Si element concentration (B) in positions within a range at a distance larger than 5 μm from the Ag electrode, is equal to or smaller than 2.

In a ceramic laminated device, Ag is used as an internal electrode of a ceramic laminated body thereof composed of at least a ceramic, a Si-containing glass, and ZnO. A ratio of C/D, i.e. a ratio of a Zn element concentration (C) in positions within a range at a distance of 5 μm or smaller from the Ag electrode to a Zn element concentration (D) in positions within a range at a distance larger than 5 μm from the Ag electrode, is equal to or smaller than 4.

In a method for manufacturing the ceramic laminated device, the oxygen concentration during firing of the ceramic laminated device is equal to or smaller than 10 vol %.

According to the ceramic laminated device and the method for manufacturing the ceramic laminated device of the present invention, even when a ceramic laminated device is formed to have an Ag internal electrode in a dielectric ceramic that can be sintered at a low temperature of approximately 900° C. and has a high dielectric constant and a high Q value, reactivity to Ag during firing can be suppressed low. Thus, a high Q value as a device can be maintained and a loss can be reduced. As a result, a small ceramic laminated device having excellent characteristics with few characteristics variations can be provided stably.

REFERENCE MARKS IN THE DRAWINGS

Figure 1:
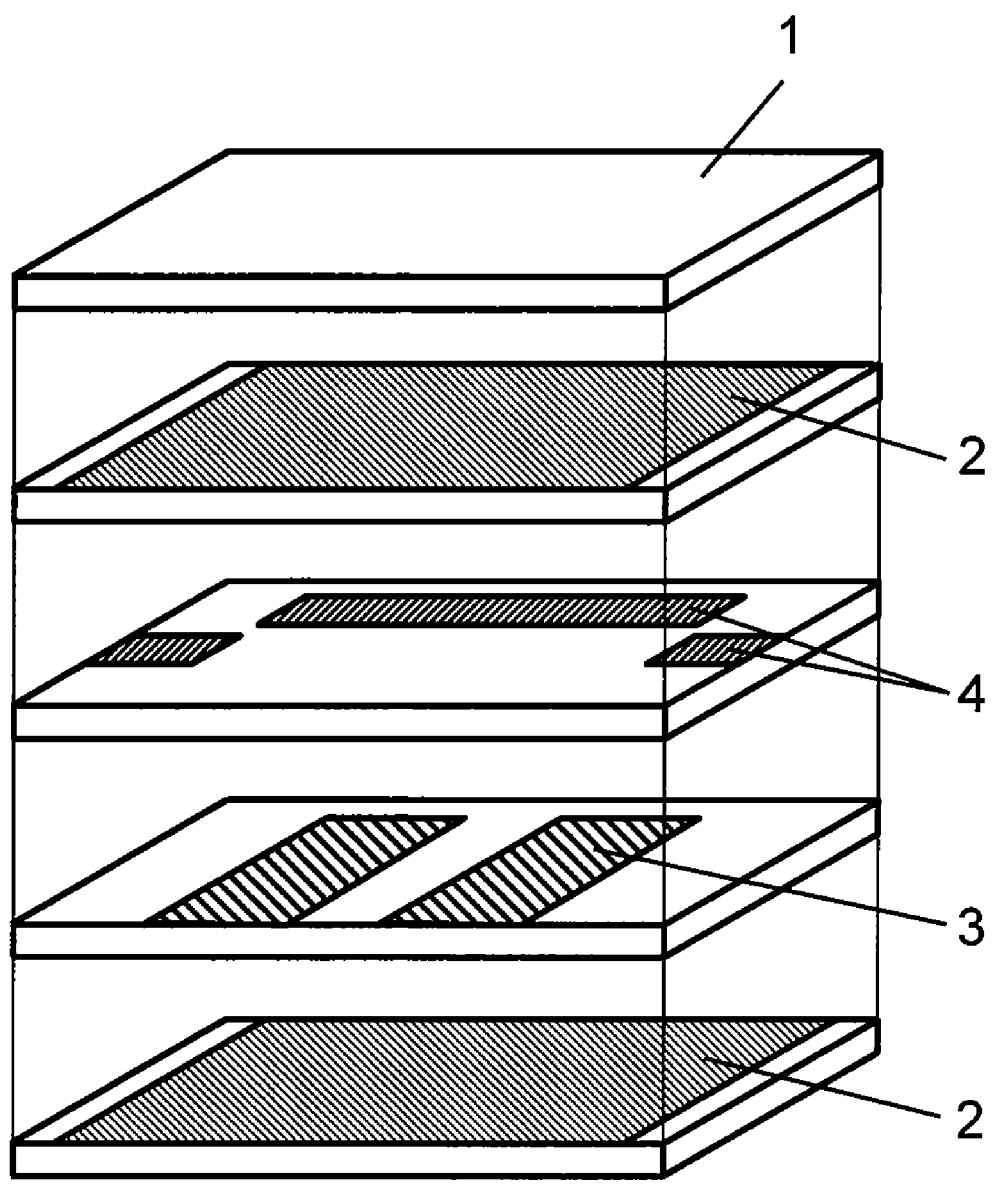
FIG. 1 is an exploded perspective view of a green sheet laminated body in accordance with an exemplary embodiment of the present invention.

1 Ceramic green sheet
2 Shield electrode
3 Strip line electrode
4 Input/output electrode
5 Ceramic element body
8 Analytical point

DETAILED DESCRIPTION OF PREFERRED EMBODIMENT

Exemplary Embodiment

Hereinafter, a description is provided of a ceramic laminated device and a method for manufacturing the ceramic laminated device in accordance with the exemplary embodiment of the present invention.

As a first ingredient of the starting material, $BaCO_3$, $Nd_2O_3$, $TiO_2$, and $Bi_2O_3$ having a chemically high purity (of 99 wt % or higher) are used. When the composition of the respective components is expressed as $xBaO$-$yNd_2O_3$-$zTiO_2$-$wBi_2O_3$ (where $x+y+z+w=100$, and each of x, y, z, and w is a molar ratio), preferably, the composition range is as follows: $12 \leq x \leq 16$, $12 \leq y \leq 16$, $65 \leq z \leq 69$, and $2 \leq w \leq 5$. In this exemplary embodiment, $Nd_2O_3$ is used as a rare-metal oxide. However, a rare-metal oxide other than Nd oxides, such as $La_2O_3$ and $Sm_2O_2$, may be used. Alternatively, a part of Nd can be substituted with another rare-metal element. The above powder and pure water are mix in a ball mill for 18 hours. After mixing, the obtained slurry is dried, placed in an alumina crucible, and calcined at temperatures in the range of 1,200 to 1,400° C. for two hours. After the calcined powder is roughly crushed, the obtained powder is pulverized in the ball mill, and dried. Thus, the powder of the first ingredient is prepared.

Next, a description is provided of synthesis of glass powder to be used as a second ingredient. As starting materials thereof, $SiO_2$, $H_3BO_3$, $Al(OH)_3$, MgO, $BaCO_3$, $CaCO_3$, $SrCO_3$, $La_2O_3$, $Li_2CO_3$, ZnO, and the like are used and weighed to have the composition to be described later. After these particles are mixed by a V-shaped blender, the mixture is placed in a platinum or platinum-rhodium crucible, melted at temperatures in the range of 1,400 to 1,600° C., and cooled rapidly by a twin roller. Thus, a glass cullet is produced. The obtained cullet is pulverized in a ball mill for eight hours and dried. Thus, the powder of the second ingredient is prepared. The synthesized second ingredient is a Si-alkali earth metal-La—O-based glass. Preferably, the glass is composed of 33 to 46 wt % of $SiO_2$, 30 to 37 wt % of BaO, and 8 to 12 wt % of $La_2O_3$. BaO may be replaced with CaO, MgO, SrO, or the like. The second ingredient may contain $Al_2O_3$, $Li_2O$, $B_2O_3$, ZnO, or the like in addition to the above components. The glass having the above composition range can crystallize and provide a crystalline phase of $BaSi_2O_5$, $Ba_2(Si_4O_{10})$ or the like during firing, thus allowing the fired material to exhibit a high Q value. Further, La contained in the glass material imparts low viscosity at high temperatures and thus increases the fluidity of the glass. As a result, sintering in the liquid phase is likely to be promoted. In this exemplary embodiment, the above glass composition is shown as an example. However, another glass can be used as long as the glass can offer the similar advantage.

Next, after the above powders are weighed to have a weight ratio of the first ingredient:the second ingredient=80:20, five parts by weight of ZnO is added, as a third ingredient, to 100 parts by weight of the mixed powder. These powders are wet-mixed and pulverized in a ball mill to prepare a pulverized powder. ZnO may be added to the glass of the second ingredient. Addition of ZnO to the glass can lower the softening point of the glass, which contributes to sintering at low temperatures. In some cases, addition of the third ingredient is unnecessary. The first and second ingredients having the above composition range can provide a ceramic composition that has a high dielectric constant, a large Q value, and a TCF of approximately 0 ppm/° C. and can be fired at temperatures of approximately 900° C.

Figure 2:
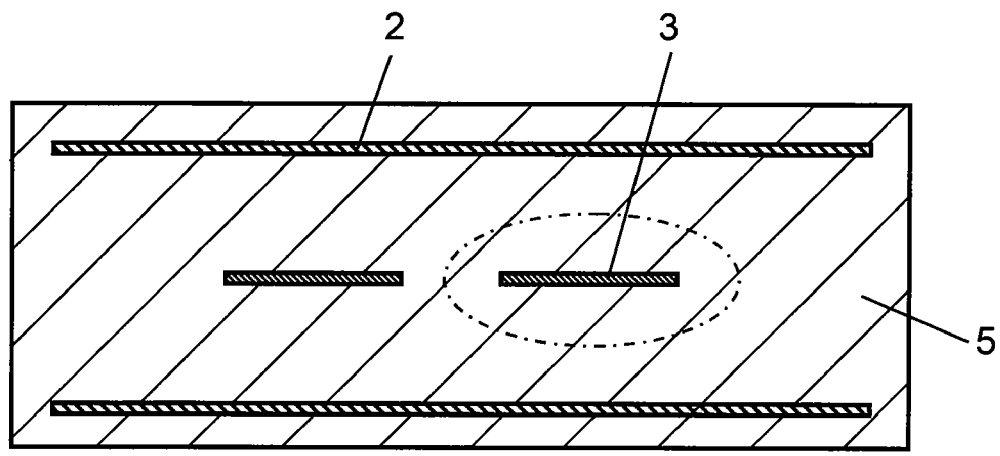
FIG. 2 is a sectional view of a ceramic laminated device in accordance with the exemplary embodiment of the present invention.

A binder, such as polyvinyl butyral and acrylic resin, a plasticizer, and further an organic solvent are added to the pulverized powder made of the first ingredient, the second ingredient, and the third ingredient. These materials are mixed and dispersed to provide a ceramic slurry. This ceramic slurry is applied to a base film, such as a PET film, by a doctor blade method, a die coating method or the like. Thus, a ceramic green sheet is prepared. An Ag paste is screen-printed onto the ceramic green sheet to form a desired electrode pattern. A desired number of printed ceramic green sheets are laminated and subjected to thermo-compression bonding. Thus, a green sheet laminated body having an electrode pattern on an internal layer or a surface layer thereof is formed. Thereafter, this laminated body is fired at temperatures in the range of 900° C. to 940° C. in an atmosphere containing oxygen in an amount of 10 vol % or smaller, to provide a ceramic laminated device having dimensions after firing of 2.5 mm in width, 2.0 mm in length, and 1 mm in thickness. The firing atmosphere is adjusted using gases, such as $N_2$, Ar, $CO_2$, $O_2$, and $H_2$. The oxygen concentration is monitored using a zirconia sensor or the like. FIG. 1 shows an exploded perspective view of a ceramic laminated body before firing (green sheet laminated body). FIG. 2 shows a sectional view of the ceramic laminated body after firing (ceramic laminated device). In these drawings, external electrodes or the like are omitted. FIG. 1 shows, as an example of the laminated structure of this device, an example of a laminated dielectric filter having a triplate structure in which strip line electrodes 3 are sandwiched between ceramic green sheets 1, i.e. dielectric layers, and input/output electrodes 4 for input/output coupling or forming a capacitor for frequency adjustment with strip line electrodes 3 are placed therein. Strip line electrodes that only work as a resonator by themselves are electromagnetic-field-coupled with each other to form a band-pass filter. All of these electrodes 2, 3, and 4 are the exemplary embodiments of the internal electrode in accordance with the present invention, and are generically referred to as internal electrodes. For strip line electrodes 3 having an identical shape, the thicker electrodes increase the Q value of the resonator, thus reducing the loss of the filter. However, in a ceramic laminated device, a thicker internal electrode has a difference in thermal expansion coefficient from the dielectric layer, and thus causes cracks in the dielectric element or gaps between the dielectric layer and the internal electrode. These phenomena can raise problems in the reliability of the device. In order to inhibit cracks generated in the dielectric element and achieve electrical characteristics of the filter at the same time, preferably, the electrode thickness is in the range of 15 μm to 35 μm.

In contrast to the strip line electrode, preferably, shield electrode 2 is formed as thin as possible. The role of the shield electrode is to shield the external electromagnetic waves across the filter and prevent changes in the filter characteristics caused by the external influences or the like. In order to achieve this role, the shield electrode is required to have an extremely large area. For this reason, if this electrode is thick, the ceramic green sheets cannot accommodate the thickness of the electrode during thermo-compression bonding of the laminated body and thus lamination failure may be caused. In many cases, a thick electrode causes delamination after firing. When the thickness of the shield electrode after firing is set as thin as 7 μm in the ceramic laminated device of the present invention, no delamination is observed after firing and the shield effect sufficient as a device is verified. In order to prevent lamination failure during lamination and provide a sufficient shield effect, preferably, the electrode thickness is in the range of 1 μm to 10 μm.

A plurality of such ceramic laminated body samples are fabricated in different oxygen concentrations during firing. Then, in order to measure the concentration distribution of the secondary phase likely to segregate in the proximity of the electrode, the sections of the fabricated samples are ground and element analysis of Si and Zn, components of the secondary phase, is made by point analysis using a wavelength dispersive type X-ray microanalyser (WDS).

Figure 3:
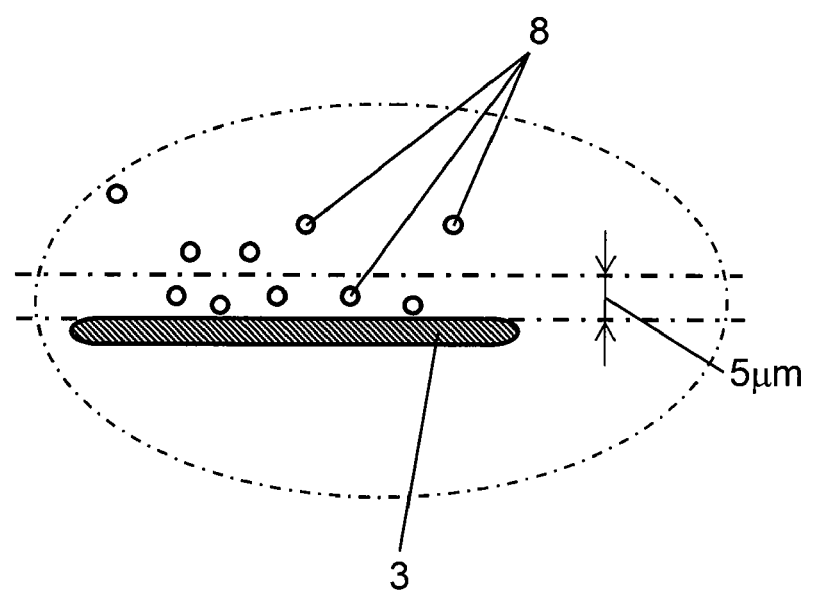
FIG. 3 is an enlarged view of the proximity of an internal electrode of the ceramic laminated device in accordance with the exemplary embodiment of the present invention.

FIG. 3 shows an enlarged view of the proximity of electrode 3 of FIG. 2 and an example of analytical points 8 to be analyzed using the WDS. Analytical points 8 are disposed in five positions within a range at a distance of 5 μm or smaller from the end of the electrode and in five positions within a range at a distance larger than 5 μm therefrom. The analytical points are selected so that an effective average of the concentrations of the secondary phase can be obtained in each of the region at a distance of 5 μm or smaller from the electrode end and the region at a distance larger than 5 μm therefrom.

Analytical results of the measurement using the WDS are as follows. For Si, the result is shown by a ratio of A/B. This is a ratio of an average Si element concentration (A) in positions at a distance of 5 μm or smaller from the Ag electrode to an average Si element concentration (B) in positions at a distance larger than 5 μm from the Ag electrode. For Zn, the result is shown by a ratio of C/D. This is a ratio of an average Zn element concentration (C) in positions at a distance of 5 μm or smaller from the Ag electrode to an average Zn element concentration (D) in positions at a distance larger than 5 μm from the Ag electrode. Ratios A/B and C/D are calculated on the basis of the averages of the measurements in the five analytical points. Ratios, such as A/B and C/D, are indexes indicating how uniformly the secondary phase is distributed. The larger ratio indicates the stronger segregation of the secondary phase in the proximity of the electrode. A ratio of 1 indicates no segregation.

Table 1 shows the relation of the Si element concentration ratio A/B with respect to an oxygen concentration during firing, and the relation of the minimum value (top loss) of the loss of the filter with respect to the oxygen concentration. Table 2 shows the relation of the Zn element concentration ratio C/D with respect to an oxygen concentration during firing, and the relation of the top loss of the filter with respect to the oxygen concentration.

The data marked with # is not applicable to the present invention (the same hereinafter).

[Table 1]

[Table 2]

Table 1 shows that when the ratio A/B of the Si element concentration A in positions at a distance of 5 μm or smaller from the Ag electrode to the Si element concentration B in positions at a distance larger than 5 μm from the Ag electrode is equal to or smaller than 2, the filter has a small top loss and exhibits excellent characteristics as a filter. On the other hand, when ratio the A/B is larger than 2, the top loss of the filer is deteriorated by at least approximately 0.3 dB in comparison with the top loss when the ratio is equal to or smaller than 2. Similarly, Table 2 shows that when the ratio C/D of the Zn element concentration C in positions at a distance of 5 μm or smaller from the Ag electrode to the Zn element concentration D in positions at a distance larger than 5 μm from the Ag electrode is larger than 4, the top loss of the filer is deteriorated by at least approximately 0.3 dB in comparison with the top loss when the ratio is equal to or smaller than 4. In each of the cases having a small top loss, the oxygen concentration is 10 vol % or smaller.

The above results show that a practical device of which filter has a small top loss can be obtained even when the concentration distribution of the secondary phase is not ideally uniform but the Si concentration ratio is equal to or smaller than 2, and the Zn concentration ratio is equal to or smaller than 4. This condition allows increases in the yield of production of the device, and stable production.

When segregation exists in close proximity to the electrode, the ratios A/B and C/D tend to be larger in the positions in closer proximity to the electrode. For the above samples, Table 3 shows a ratio of A'/B', i.e. a ratio of a Si element concentration (A') in positions at a distance of 2 μm or smaller from the Ag electrode to a Si element concentration (B') in positions at a distance larger than 2 μm from the Ag electrode. Table 4 shows a ratio of C'/D', i.e. a ratio of a Zn element concentration (C') in positions at a distance of 2 μm or smaller from the Ag electrode to a Zn element concentration (D') in positions at a distance larger than 2 μm from the Ag electrode.

[Table 3]

[Table 4]

As shown in Table 3 and Table 4, more preferably, the ratio A'/B' is equal to or lower than 4 and the ratio C'/D' is equal to or lower than 5, when the analytical range is set in closer proximity to the electrode.

The above results show that a low oxygen concentration during firing reduces segregation of Si or Zn, or a multiple oxide thereof in the proximity of the Ag electrode. Segregation of these substances in the proximity of the Ag electrode makes a condition in which differences in thermal expansion cause generation of cracks and a decrease in adhesion between the Ag electrode and the ceramic element body is likely to cause generation of gaps or defects. In contrast, a condition having less segregation of the above substances can provide an interface condition having excellent adhesion without gaps or defects generated between the Ag electrode and the ceramic element body. As a result, this condition is considered to have led to the improvement of the Q value and thus reduction of the filter loss.

INDUSTRIAL APPLICABILITY

A ceramic laminated device of the present invention includes a dielectric ceramic composed of a ceramic and a Si-containing glass, and uses Ag as internal electrode thereof. Such ceramic laminated devices having a high Q value and low loss can stably be produced at high yield by inhibiting the reactivity to Ag and controlling segregation of Si in the proximity of the electrode. The present invention is extremely useful for forming a device for high-frequency applications, such as a filter.

TABLE 1

| No. | $O_2$ concentration (vol %) | A/B ratio | Top loss (dB) |
| --- | --- | --- | --- |
| 1 | <0.001 | 1.5 | 2.13 |
| 2 | 0.01 | 1.9 | 2.14 |
| 3 | 0.1 | 1.7 | 2.13 |
| 4 | 1 | 1.5 | 2.15 |
| 5 | 5 | 1.8 | 2.15 |
| 6 | 10 | 1.8 | 2.14 |
| #7 | 20 | 3.2 | 2.48 |

TABLE 2

| No. | $O_2$ concentration (vol %) | C/D ratio | Top loss (dB) |
| --- | --- | --- | --- |
| 1 | <0.001 | 1.9 | 2.13 |
| 2 | 0.01 | 2 | 2.14 |
| 3 | 0.1 | 1.8 | 2.13 |
| 4 | 1 | 2.1 | 2.15 |
| 5 | 5 | 2.5 | 2.15 |
| 6 | 10 | 2.2 | 2.14 |
| #7 | 20 | 4.6 | 2.48 |

TABLE 3

| No. | $O_2$ concentration (vol %) | A'/B' ratio |
| --- | --- | --- |
| 1 | <0.001 | 2.1 |
| 2 | 0.01 | 2.6 |
| 3 | 0.1 | 2.5 |
| 4 | 1 | 2.4 |
| 5 | 5 | 2.5 |
| 6 | 10 | 2.2 |
| #7 | 20 | 4.9 |

TABLE 4

| No. | $O_2$ concentration (vol %) | C'/D' ratio |
| --- | --- | --- |
| 1 | <0.001 | 1.5 |
| 2 | 0.01 | 1.7 |
| 3 | 0.1 | 1.7 |
| 4 | 1 | 1.6 |
| 5 | 5 | 1.8 |
| 6 | 10 | 1.8 |
| #7 | 20 | 5.5 |

The invention claimed is:

1. A ceramic laminated device made by sintering a ceramic laminated body including at least a ceramic and a Si-containing glass, the ceramic laminated device comprising:
    an internal electrode including Ag,
    wherein a ratio of A/B, i.e. a ratio of a Si element concentration (A) within a range at a distance of 5 μm or smaller from the internal electrode to a Si element concentration (B) within a range at a distance larger than 5 μm from the internal electrode, is equal to or smaller than 2.

2. The ceramic laminated device of claim 1, wherein at least one layer of the internal electrode having a thickness equal to or larger than 15 μm after sintering is included therein.

3. The ceramic laminated device of claim 2, wherein at least one layer of the internal electrode having a thickness equal to or smaller than 10 μm after sintering is included therein.

4. The ceramic laminated device of claim 1, wherein ZnO is included in the glass.

5. The ceramic laminated device of claim 1, wherein the glass is Si-alkali earth metal-La—O-based.

6. The ceramic laminated device of claim 1, wherein the ceramic includes Ba, a rare-earth element, Ti, Bi, and O.

7. A method for manufacturing the ceramic laminated device of claim 1, wherein an oxygen concentration during sintering of the ceramic laminated device is equal to or smaller than 10 vol %.

8. A ceramic laminated device made by sintering a ceramic laminated body including at least a ceramic, a Si-containing glass, and ZnO, the ceramic laminated device comprising:
    an internal electrode including Ag,
    wherein a ratio of C/D, i.e. a ratio of a Zn element concentration (C) within a range at a distance of 5 μm or smaller from the internal electrode to a Zn element concentration (D) within a range at a distance larger than 5 μm from the internal electrode, is equal to or smaller than 4.

9. The ceramic laminated device of claim 8, wherein at least one layer of the internal electrode having a thickness equal to or larger than 15 μm after sintering is included therein.

10. The ceramic laminated device of claim 8, wherein ZnO is included in the glass.

11. The ceramic laminated device of claim 8, wherein the glass is Si-alkali earth metal-La—O-based.

12. The ceramic laminated device of claim 8, wherein the ceramic includes Ba, a rare-earth element, Ti, Bi, and O.

13. A method for manufacturing the ceramic laminated device of claim 8, wherein an oxygen concentration during sintering of the ceramic laminated device is equal to or smaller than 10 vol %.

* * * * *